(12) United States Patent
Litz et al.

(10) Patent No.: US 7,217,774 B2
(45) Date of Patent: May 15, 2007

(54) ELECTROACTIVE POLYMER, DEVICE MADE THEREFROM AND METHOD

(75) Inventors: Kyle Erik Litz, Ballston Spa, NY (US); Joseph John Shiang, Niskayuna, NY (US); Christian Maria Anton Heller, Albany, NY (US)

(73) Assignee: General Electric Company, Niskayuna, NY (US)

( * ) Notice: Subject to any disclaimer, the term of this patent is extended or adjusted under 35 U.S.C. 154(b) by 360 days.

(21) Appl. No.: 10/814,748

(22) Filed: Apr. 1, 2004

(65) Prior Publication Data

US 2005/0222352 A1 Oct. 6, 2005

(51) Int. Cl.
*C08F 28/06* (2006.01)
(52) U.S. Cl. .............. 526/257; 526/259; 526/260; 526/329.2; 526/347
(58) Field of Classification Search .............. 526/257, 526/259, 260, 329.2, 347
See application file for complete search history.

(56) References Cited

U.S. PATENT DOCUMENTS

2004/0234809 A1* 11/2004 Chen et al. ............. 428/690

OTHER PUBLICATIONS

Belfield et al. Polymeric Materials Science and Engineering (2001), 84, 660-661.*

K.D. Belfield, et al, "Synthesis of New Two-Photon Absorbing Fluorene Derivatives via Cu-Mediated Ullmann Condensations", J. Org. Chem., vol. 15(65), 4475 (2000).

R. Kannan, et al, "Diphenylaminofluorene-Based Two-Photon-Absorbing Chromophores with Various p-Electron Acceptors", Chem. Mat., vol. 13, 1896 (2001).

S.M. Kirkpatrick, et al, "Holographic recording using two-photon-induced photopolymerization", Appl. Phys. A, , vol. 69, 461 (1999).

* cited by examiner

*Primary Examiner*—Helen L. Pezzuto
(74) *Attorney, Agent, or Firm*—Mary Louise Gioeni; William E. Powell, III

(57) ABSTRACT

Disclosed are polymers comprising 2-(7-benzothiazolyl-9, 9-disubstituted fluorene) structural units of the formula

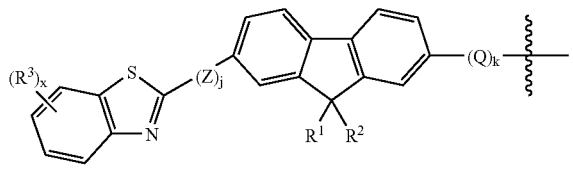

wherein $R^1$ and $R^2$ are each independently an alkyl group, an aralkyl group, an aryl group, or an $—Si(R)_3$ group wherein R is an alkyl group; $R^3$ is selected from the group consisting of an electron-donating substituent and an electron-withdrawing substituent; x has the value of from zero up to the number of hydrogens available for substitution on the aromatic ring; Z and Q are each independently a group which is in conjugation with both the fluorene group and the benzothiazole group; and the parameters j and k each independently have the value of 0–2. Electroactive devices comprising said polymers, methods for preparing said polymers, and monomers for preparing said polymers are also disclosed.

27 Claims, 3 Drawing Sheets

ELECTROACTIVE POLYMER, DEVICE MADE THEREFROM AND METHOD

BACKGROUND OF THE INVENTION

The present invention relates to electroactive polymers and electroactive devices comprising said polymers. In a particular embodiment the present invention relates to polymers comprising side-chain 2-(7-benzothiazolyl-9,9-disubstituted fluorene) structural units and methods for preparing them.

Electroactive compounds containing a side-chain 9,9-disubstituted fluorene structural unit have been described in U.S. Pat. No. 6,312,839. However, these electroactive compounds are low molecular weight, non-polymeric compounds which require a conjugated polymeric backbone accompanying the 9,9-disubstituted fluorene side-chain. It remains of interest, therefore, to develop polymeric electroactive materials, particularly for use in electroactive devices.

BRIEF DESCRIPTION OF THE INVENTION

The present inventors have discovered novel polymers which may be employed in applications such as electroactive devices. In one embodiment the present invention is directed to a polymer comprising 2-(7-benzothiazolyl-9,9-disubstituted fluorene) structural units of the formula

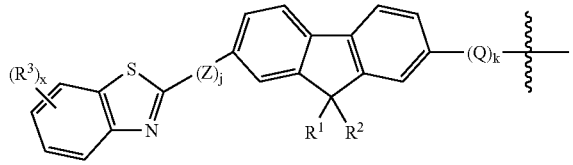

wherein $R^1$ and $R^2$ are each independently an alkyl group, an aralkyl group, an aryl group, or an —Si(R)$_3$ group wherein R is an alkyl group; $R^3$ is selected from the group consisting of an electron-donating substituent and an electron-withdrawing substituent; x has the value of from zero up to the number of hydrogens available for substitution on the aromatic ring; Z and Q are each independently a group which is in conjugation with both the fluorene group and the benzothiazole group; and the parameters j and k each independently have the value of 0–2. In another embodiment the present invention is directed to a method for making the said polymers. In still another embodiment the present invention is directed to a monomer to make said polymers. In still another embodiment the present invention is directed to electroactive devices comprising said polymers.

Various other features, aspects, and advantages of the present invention will become more apparent with reference to the following description and appended claims.

DETAILED DESCRIPTION OF THE INVENTION

Figure 1:
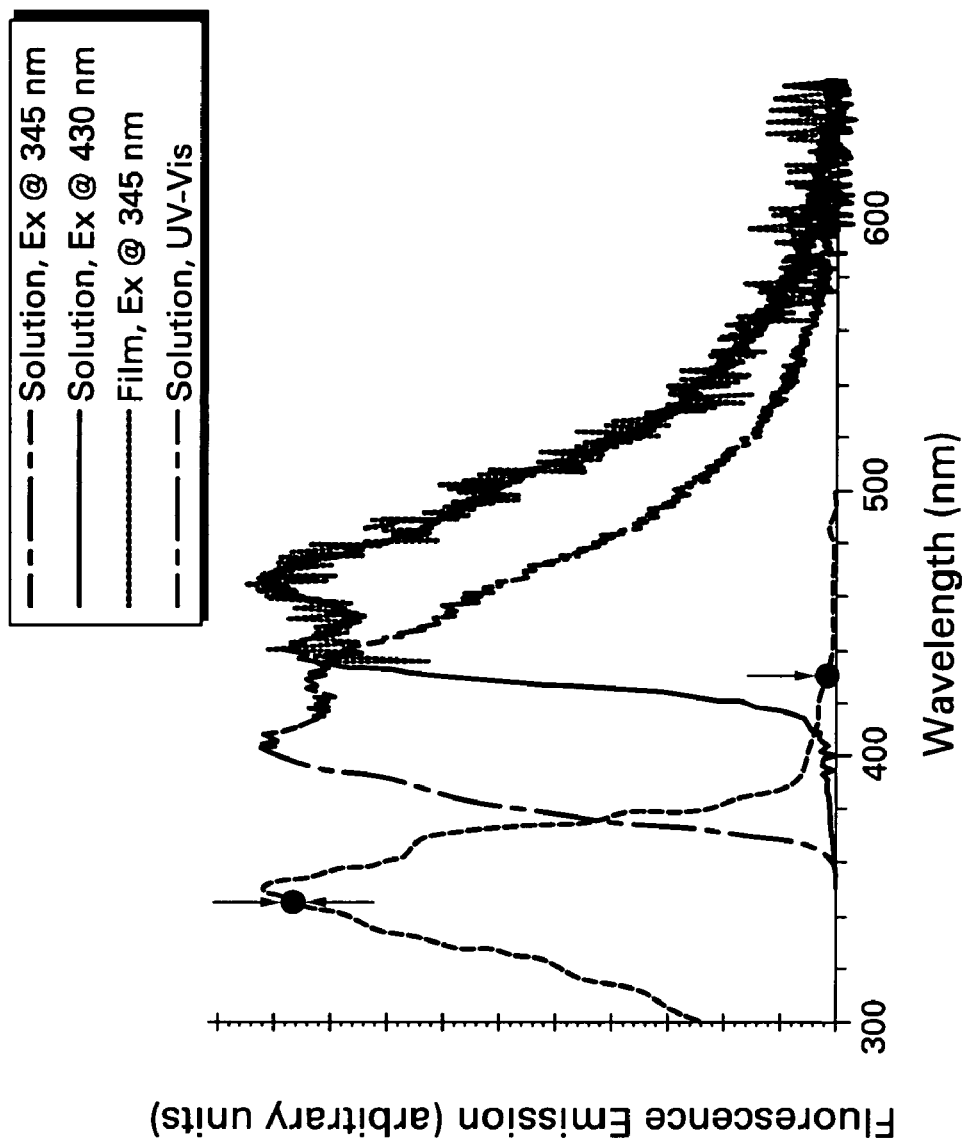
FIG. 1 shows film and chloroform solution optical properties of PVFB.

In the following specification and the claims which follow, reference will be made to a number of terms which shall be defined to have the following meanings. The singular forms "a", "an" and "the" include plural referents unless the context clearly dictates otherwise. "Optional" or "optionally" means that the subsequently described event or circumstance may or may not occur, and that the description includes instances where the event occurs and instances where it does not. The term "electroactive" as used herein refers to a material that is (1) capable of transporting, blocking or storing charge (either plus charge or minus charge), (2) luminescent, typically although not necessarily fluorescent, and/or (3) useful in photo-induced charge generation. An "electroactive device" is a device comprising an electroactive material. As used herein the term "polymer" may refer to either homopolymers derived from essentially a single monomer or to copolymers derived from at least two monomers, or to both homopolymers and copolymers.

Polymers suitable for use in an electroactive device of the present invention comprise 2-(7-benzothiazolyl-9,9-disubstituted fluorene) structural units as shown in formula (I):

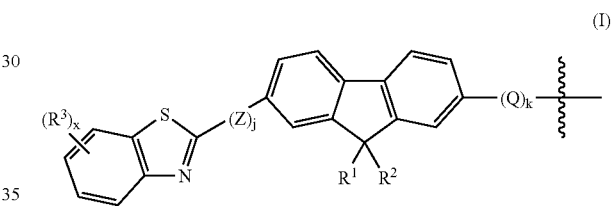

wherein $R^3$ is selected from the group consisting of an electron-donating substituent and an electron-withdrawing substituent; x has the value of from zero up to the number of hydrogens available for substitution on the aromatic ring; Z and Q are each independently a group which is in conjugation with both the fluorene group and the benzothiazole group; and the parameters j and k each independently have the value of 0–2. In a particular embodiment x is zero. In another particular embodiment x is at least one and $R^3$ is alkyl; alkoxy; nitrile; halogen, chloro, bromo, fluoro; or nitro. In one particular embodiment j or k or both j and k have the value of 1, and Z or Q or both Z and Q are selected from the group consisting of phenyl, substituted phenyl, ethenyl, substituted ethenyl, fluorenyl and the like. It is to be understood that when both j and k have a value of greater than zero, then Z and Q may be the same or different. In another particular embodiment both j and k have the value of zero. Those skilled in the art will recognize that the insertion of spacer groups such as Z and Q may be employed to change the wavelength of emission of the corresponding polymers. In the structure of formula (I) the unsubstituted sites on the aromatic rings may comprise hydrogen, deuterium or a mixture of hydrogen and deuterium. In a particular embodiment the unsubstituted sites on the aromatic rings comprise hydrogen.

The $R^1$ and $R^2$ substituents may be the same or different. In some particular embodiments the $R^1$ and $R^2$ substituents are each independently an alkyl group, an aralkyl group, an aryl group, or an —Si(R)$_3$ group wherein R is an alkyl group.

The term "alkyl" as used in the various embodiments of the present invention is intended to designate linear alkyl, branched alkyl, aralkyl, cycloalkyl, bicycloalkyl, tricycloalkyl and polycycloalkyl radicals containing carbon and hydrogen atoms, and optionally containing atoms in addition to carbon and hydrogen, for example atoms selected from Groups 15, 16 and 17 of the Periodic Table. Illustrative examples of substituents on alkyl groups include, but are not limited to, ether, ester and halogen. Alkyl groups may be saturated or unsaturated, and may comprise, for example, vinyl or allyl. In particular embodiments alkyl groups are saturated. The term "alkyl" also encompasses that alkyl portion of alkoxy groups and the alkyl portion of silyl groups, $—Si(R)_3$. In various embodiments normal and branched alkyl radicals are those containing from 1 to about 32 carbon atoms, and include as illustrative non-limiting examples $C_1$–$C_{32}$ alkyl (optionally substituted with one or more groups selected from $C_1$–$C_{32}$ alkyl, $C_3$–$C_{15}$ cycloalkyl or aryl); and $C_3$–$C_{15}$ cycloalkyl optionally substituted with one or more groups selected from $C_1$–$C_{32}$ alkyl. Some particular illustrative examples comprise methyl, ethyl, n-propyl, isopropyl, n-butyl, sec-butyl, tertiary-butyl, pentyl, neopentyl, hexyl, heptyl, octyl, nonyl, decyl, undecyl and dodecyl. Some illustrative non-limiting examples of cycloalkyl and bicycloalkyl radicals include cyclobutyl, cyclopentyl, cyclohexyl, methylcyclohexyl, cycloheptyl, bicycloheptyl and adamantyl.

In various embodiments aralkyl radicals are those containing from 7 to about 14 carbon atoms; these include, but are not limited to, benzyl, phenylbutyl, phenylpropyl, and phenylethyl. The term "aryl" as used in the various embodiments of the present invention is intended to designate substituted or unsubstituted aryl radicals containing from 6 to 20 ring carbon atoms. Some illustrative non-limiting examples of these aryl radicals include $C_6$–$C_{20}$ aryl optionally substituted with one or more groups selected from $C_1$–$C_{32}$ alkyl, $C_3$–$C_{15}$ cycloalkyl or aryl. Some particular illustrative examples of aryl radicals comprise substituted or unsubstituted phenyl, biphenyl, toluyl, naphthyl and binaphthyl.

In other particular embodiments the $R^1$ and $R^2$ substituents are each independently selected from the group consisting of t-butyl, dimethylhexyl, ethylhexyl, n-octyl, $C_6$–$C_{32}$ alkyl (optionally substituted with one or more groups selected from $C_1$–$C_6$ alkyl); phenyl; and trialkylsilyl groups with alkyl groups comprising 1–10 carbon atoms, such as trimethylsilyl. In still other particular embodiments the $R^1$ and $R^2$ substituents are different. In still other particular embodiments the $R^1$ and $R^2$ substituents are the same. In still other particular embodiments neither of the $R^1$ and $R^2$ substituents is hydrogen.

In one embodiment polymers comprising 2-(7-benzothiazolyl-9,9-disubstituted fluorene) structural units comprise homopolymers with said structural units present as sidechains pendant from the main polymer chain. In this particular embodiment the polymer backbone is non-conjugated. Illustrative examples of such homopolymers include, but are not limited to, those of the formula (II) wherein $R^1$, $R^2$, $R^3$, x, Z, Q, j and k have the values described herein above:

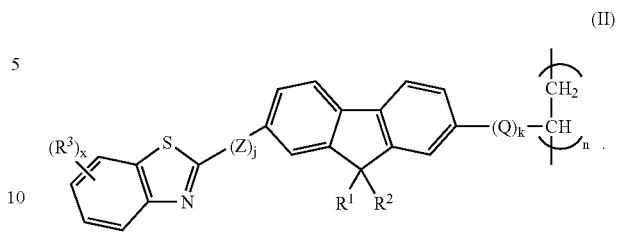

The molecular weight of the homopolymer is not particularly critical provided that a layer comprising said homopolymer may be processed for inclusion into an electroactive device. In some embodiments the value for n is such to provide a homopolymer weight average molecular weight in one embodiment in a range of about 4,000 and about 200,000; in another embodiment in a range of about 10,000 and about 200,000; in another embodiment in a range of about 20,000 and about 120,000; in another embodiment in a range of about 50,000 and about 120,000; in another embodiment in a range of about 50,000 and about 100,000; and in another embodiment in a range of about 60,000 and about 80,000, as determined by gel permeation chromatography in chloroform versus polystyrene standards. In other particular embodiments the value for n is such to provide a homopolymer molecular weight in one embodiment in a range of about 4,000 and about 30,000; in another embodiment in a range of about 5,000 and about 25,000; and in another embodiment in a range of about 6,000 and about 12,000, as determined by gel permeation chromatography in chloroform versus polystyrene standards. In still another particular embodiment the value for n is such to provide a homopolymer molecular weight in a range of about 20,000 and about 26,000, as determined by gel permeation chromatography in chloroform versus polystyrene standards.

Homopolymers of the formula (II) may be derived, for example, from polymerization of a monomer of the formula (III) wherein $R^1$, $R^2$, $R^3$, x, Z, Q, j and k have the values described herein above:

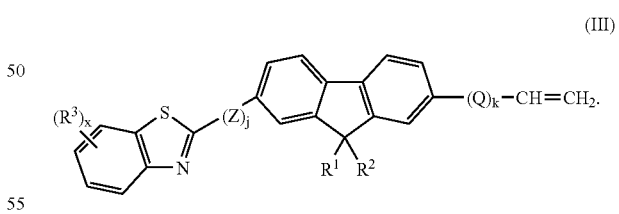

In another embodiment polymers comprising 2-(7-benzothiazolyl-9,9-disubstituted fluorene) structural units comprise copolymers with said structural units present as sidechains pendant from the main polymer chain. In this particular embodiment the polymer backbone is non-conjugated. Illustrative examples of such copolymers include, but are not limited to, those comprising structural units derived from alkenyl aromatic compounds such as those of the formula (IV) wherein $R^1$, $R^2$, $R^3$, x, Z, Q, j and k have the values described herein above:

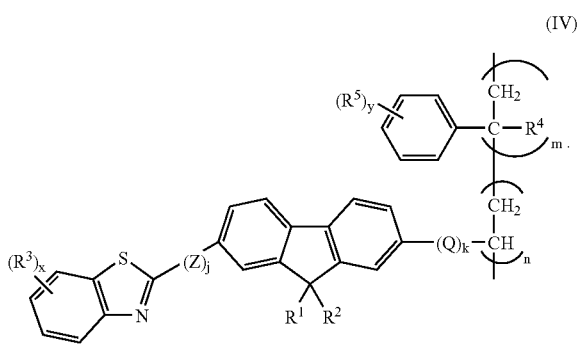

(IV)

In formula (IV) $R^4$ is hydrogen or alkyl, and $R^5$ is selected from the group consisting of an electron-donating substituent and an electron-withdrawing substituent; and y has the value of from zero up to the number of hydrogens available for substitution. In a particular embodiment y is zero. In another particular embodiment y is at least one and $R^5$ is alkyl; alkoxy; halogen; chloro; bromo; fluoro; nitrile or nitro. Copolymers such as that depicted in formula (IV) may be derived by copolymerization of a polymerizable monomer, such as a vinyl monomer comprising 2-(7-benzothiazolyl-9,9-disubstituted fluorene) structural units such as in formula (III) with at least one alkenyl aromatic compound. In particular embodiments alkenyl aromatic compounds comprise styrene and substituted styrenes having one or more alkyl, alkoxy, hydroxy or halo substituent groups attached to the aromatic ring, including, but not limited to, alpha-methyl styrene, 2-methylstyrene, 3-methylstyrene, 4-methylstyrene, alpha-methyl vinyltoluene, vinyl xylene, trimethyl styrene, 3,5-diethylstyrene, 4-n-propylstyrene, butyl styrene, 2-t-butylstyrene, 3-t-butylstyrene, 4-t-butylstyrene, styrenes having from 1 to 5 halogen substituents on the aromatic ring, chlorostyrene, alpha-chlorostyrene, dichlorostyrene, tetrachlorostyrene, bromostyrene, alpha-bromostyrene, dibromostyrene, p-hydroxystyrene, p-acetoxystyrene, methoxystyrene, vinyl-substituted condensed aromatic ring structures, such as, for example, vinyl naphthalene, vinyl anthracene, and the like, and mixtures of alkenyl aromatic compounds.

In other embodiments illustrative examples of copolymers with 2-(7-benzothiazolyl-9,9-disubstituted fluorene) structural units present as side-chains pendant from the main polymer chain include, but are not limited to, those copolymers comprising structural units derived from at least one monoethylenically unsaturated alkyl (meth)acrylate monomer selected from $(C_1-C_{12})$alkyl(meth)acrylate monomers and mixtures comprising at least one of said monomers. As used herein, the terminology "monoethylenically unsaturated" means having a single site of ethylenic unsaturation per molecule, and the terminology "(meth)acrylate monomers" refers collectively to acrylate monomers and methacrylate monomers. As used herein, the terminology "$(C_x-C_y)$", as applied to a particular unit, such as, for example, a chemical compound or a chemical substituent group, means having a carbon atom content of from "x" carbon atoms to "y" carbon atoms per such unit. For example, "$(C_1-C_{12})$alkyl" means an alkyl group having from 1 to 12 carbon atoms per group. Suitable $(C_1-C_{12})$ alkyl(meth)acrylate monomers include, but are not limited to, $(C_1-C_{12})$alkyl acrylate monomers, illustrative examples of which include ethyl acrylate, butyl acrylate, iso-pentyl acrylate, n-hexyl acrylate, and 2-ethyl hexyl acrylate; and their $(C_1-C_{12})$alkyl methacrylate analogs, illustrative examples of which include methyl methacrylate, ethyl methacrylate, propyl methacrylate, iso-propyl methacrylate, butyl methacrylate, hexyl methacrylate, and decyl methacrylate. In a particular embodiment of the present invention a copolymer comprises structural units derived from methyl methacrylate.

In copolymers of the present invention the portion of the copolymer derived from alkenyl aromatic compound or from monoethylenically unsaturated alkyl (meth)acrylate monomer is in an amount in one embodiment in a range of between about 0.5 wt. % and about 85 wt. %; in another embodiment in a range of between about 0.5 wt. % and about 75 wt. %; in another embodiment in a range of between about 10 wt. % and about 55 wt. %; in another embodiment in a range of between about 10 wt. % and about 55 wt. %; in another embodiment in a range of between about 20 wt. % and about 55 wt. %; in another embodiment in a range of between about 30 wt. % and about 55 wt. %; and in another embodiment in a range of between about 40 wt. % and about 55 wt. %, based on the total weight of the copolymer. In a particular embodiment the values for n and m in formula (IV) are such that the portion of the copolymer derived from alkenyl aromatic compound is in the ranges described herein above. In another particular embodiment the values for n and m in formula (IV) are such that the portion of the copolymer derived from alkenyl aromatic compound is in an amount in a range of between about 45 wt. % and about 55 wt. %, based on the total weight of the copolymer.

In other embodiments illustrative examples of copolymers with 2-(7-benzothiazolyl-9,9-disubstituted fluorene) structural units present as side-chains pendant from the main polymer chain include, but are not limited to, those copolymers comprising structural units derived from a mixture of at least one alkenyl aromatic compound and at least one monoethylenically unsaturated alkyl (meth)acrylate monomer selected from $(C_1-C_{12})$alkyl(meth)acrylate monomers. In these embodiments 2-(7-benzothiazolyl-9,9-disubstituted fluorene) structural units are typically present such copolymers in an amount of less than about 50 wt. %; and the wt./wt. ratio of structural units derived from alkenyl aromatic compound to structural units derived from monoethylenically unsaturated alkyl (meth)acrylate monomer is in a range of between 10:90 and 90:10. Copolymers comprising 2-(7-benzothiazolyl-9,9-disubstituted fluorene) structural units may be random or block. In a particular embodiment suitable copolymers have random structure.

The molecular weight of the copolymer is not particularly critical provided that layer comprising said copolymer may be processed for inclusion into an electroactive device. In some embodiments the values for n and m are such to provide a copolymer weight average molecular weight in one embodiment in a range of about 4,000 and about 200,000; in another embodiment in a range of about 10,000 and about 200,000; in another embodiment in a range of about 20,000 and about 120,000; in another embodiment in a range of about 50,000 and about 120,000; in another embodiment in a range of about 50,000 and about 100,000; and in another embodiment in a range of about 60,000 and about 80,000, as determined by gel permeation chromatography in chloroform versus polystyrene standards.

Polymers of the present invention may be employed in electroactive devices. In one embodiment said polymers may be employed in an emissive layer in an electroactive device. In such embodiments the electroactive device typically comprises: (a) an anode; (b) a cathode; and (c) a layer of light emitting material comprising a polymer of the present invention. In some specific embodiments the electroactive device typically comprises: (i) a substrate; (ii) an anode formed over the substrate; (iii) optionally a layer of a conductive polymer or a hole transporter material formed over the anode; (iv) a layer of light emitting material comprising a polymer of the present invention; (v) optionally a layer comprising a hole-blocking material; (vi) optionally a layer of an electron transporter material; and (vii) a cathode. In such embodiments wherein the polymer is present in an emissive layer, the electroactive device typically emits light in the wavelength range of about 400 nm to about 650 nm, or in the wavelength range of about 400 nm to about 550 nm, or in the wavelength range of about 400 nm to about 500 nm.

In another embodiment said polymers may be employed in a hole-blocking layer in an electroactive device. In such embodiments the electroactive device typically comprises: (a) an anode; (b) a cathode; and (c) a hole-blocking layer comprising a polymer of the present invention. In some specific embodiments the electroactive device typically comprises: (i) a substrate; (ii) an anode formed over the substrate; (iii) a layer of a conductive polymer or a hole transporter material formed over the anode; (iv) a layer of light emitting material formed over the hole transporter material; (v) a layer of a hole-blocking material comprising a polymer of the present invention (vi) a layer of an electron transporter material formed over the light emitting material; and (vii) a cathode formed over the layer of electron transporter material.

A polymer comprising 7-benzothiazolyl-9,9-dialkylfluorene structural units of the present invention may be used in any electroactive device in which an emissive layer or a hole blocking layer may be beneficially employed. In some embodiments the polymer is employed in an electroluminescent device, an LED, an OLED, a photovoltaic device, a photoconductor, a photodetector, or in a chemical or biochemical sensor. Electroluminescent devices are used, for example, as self-illuminating display elements, such as control lamps, alphanumeric displays, signs, or in optoelectronic couplers and like applications.

Suitable cathode materials for electroactive devices generally comprise those having a low work function value such that a relatively small voltage causes emission of electrons from the cathode. Illustrative examples of cathode materials generally comprise K, Li, Na, Rb, Mg, La, Ce, Ca, Sr, Ba, Al, Ag, In, Sn, Zn, Zr, or mixtures thereof. Other illustrative examples of cathode materials may comprise alkali metal fluorides, or alkaline earth fluorides, or mixtures of fluorides. Other illustrative examples of cathode materials may comprise a metal such as gold, indium, manganese, tin, lead, aluminum, silver, magnesium, or alloys thereof; particularly a magnesium/silver, magnesium/indium, calcium/aluminum or lithium/aluminum alloy. Alternatively, the cathode can be made of two layers to enhance electron injection. Illustrative examples include, but are not limited to, an inner layer of either LiF or NaF followed by an outer layer of aluminum or silver, or an inner layer of calcium followed by an outer layer of aluminum or silver. Suitable anode materials for electroactive devices typically comprise those having a high work function value. Illustrative examples of anode materials include, but are not limited to, indium tin oxide (ITO), tin oxide, indium oxide, zinc oxide, indium zinc oxide, nickel, gold, and mixtures thereof.

The layer comprising a polymer of the invention may be applied by any suitable conventional technique such as spin-casting, spraying, dip coating, draw bar coating, gravure coating, silk screening, air knife coating, reverse roll coating, vacuum deposition, chemical treatment and the like. For convenience in obtaining thin layers, the said layers are often applied in the form of a dilute solution, with the solvent being removed after deposition of the coating by conventional techniques such as by vacuum, heating and the like. In another embodiment a layer comprising a polymer of the invention may be formed into a film using conventional techniques such as, but not limited to, compression molding and film extrusion. Said film may be employed in fabricating an electroactive device using conventional techniques such as, but not limited to, lamination. In some embodiments two or more layers of the electroactive device may be prepared in a separate step and combined before assembly of the final electroactive device.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

In the following examples the abbreviation "PVFB" means the homopolymer poly(vinyl fluorene benzothiazole). The abbreviation "PVFBS" means the copolymer poly(vinyl fluorene benzothiazole-co-styrene).

EXAMPLE 1

Synthesis of 2-bromo-7-formyl-9,9'-dioctylfluorene: Butyl lithium (71 milliliters (mL), 0.116 moles) was added dropwise to a mechanically stirred solution of 2,7-dibromo-9,9'-dioctylfluorene (50.33 grams (g), 0.0918 moles) in tetrahydrofuran (200 mL) at minus 78° C. while under continuous nitrogen purge. After the addition was complete (approximately 45 minutes), the reaction was stirred for an additional 30 minutes. Dimethylformamide (10.62 mL, 0.1539 moles) was then added rapidly via syringe at minus 78° C., and the reaction was continued whilst warming to room temperature over four hours. The flask contents were concentrated to dryness. The yellow oil residue was dissolved in a 130 mL mixture of hexanes and xylenes (10:3), and quenched with 5 mL of 20% hydrochloric acid solution. After separation from the aqueous fraction, the organic layer was neutralized with sodium bicarbonate (10 g), filtered, dried over magnesium sulfate (10 g), and decolorized with activated carbon (10 g). The final solution was filtered and concentrated to yield a colorless solid with a faint greenish hue. The light greenish hue was removed by suspension in methanol. The yield was 37.87 g (83% yield) of a colorless microcrystalline solid with melting point=48°–50° C. 1H Nuclear magnetic resonance spectroscopy (NMR) was consistent with the desired product.

EXAMPLE 2

Synthesis of 2-bromo-7-benzothiazolyl-9,9'-dioctylfluorene: A mixture of the compound from Example 1 (30.00 g, 0.0603 moles) and 2-aminothiophenol (8.6806 g, 0.0693 moles) in dimethyl sulfoxide (80 mL) was heated for 1 hour at 198° C. under nitrogen purge. The reaction was then quenched by pouring into 100 mL cold de-ionized water. The aqueous layer was decanted from the bright yellow oil and extracted twice with 25 mL pentane. The organic layers were combined with the oil residue and quenched with 20 mL of 20% acetic acid. The layers were separated and the acidic solution was extracted twice with 25 mL pentane. The organic fractions were combined and neutralized by washing twice with 100 mL of saturated sodium bicarbonate solution. The basic solution was extracted twice with 25 mL of pentane. The organic fractions were combined and dried over magnesium sulfate and decolorized with activated carbon to leave a bright yellow solution. Concentration in vacuo resulted in 29.68 g of recovered yellow oil. The product was purified by column chromatography (alumina, 1500 g) eluted with a mixture of xylenes and cyclohexane (4:1) and re-crystallized from cold methanol. The yield was 18.0 g (53% yield) of a colorless crystalline solid with melting point 79°–81° C.

EXAMPLE 3

Synthesis of 2-vinyl-7-benzothiazolyl-9,9'-dioctylfluorene (formula III): A mixture of the compound from Example 2 (5.00 g, 0.0083 moles), cesium fluoride (2.66 g, 0.0175 moles), tris(dibenzylideneacetone)dipalladium (0.0380 g, 0.041 mmoles), and tri-t-butylphosphine (2.50 g, 0.123 mmoles, added as a 10% solution in hexanes) and tributyl(vinyl)stannane (2.767 g, 0.0087 moles) in tetraglyme (6 g) and toluene (7 mL) was heated for 14 hours at 90° C. under nitrogen in a sealed 30 mL vial. The reaction contained a blue-green precipitate upon cooling to room temperature. The contents of the flask were extracted with 20 mL of diethyl ether. The white solid residue was filtered leaving a bright orange organic solution. The organic layer was dried and decolorized with 2.0 g activated charcoal and 2.0 g 4Å molecular sieves. The light orange solution was concentrated and the remaining oil was added dropwise into dry acetonitrile leaving 4.0 g of a bright yellow solid. The bright yellow solid was then extracted twice with 10 mL diethyl ether leaving an insoluble white solid. The ether extract was concentrated by rotary evaporation to yield 2.8 g (61% yield) of a yellow microcrystalline product. The yellow solid was analyzed by $^1$H and $^{13}$C NMR confirming the synthesis in greater than 95% purity.

EXAMPLE 4

Synthesis of poly(2-vinyl-7-benzothiazolyl-9,9'-dioctylfluorene): 2-Vinyl-7-benzothiazolyl-9,9'-dioctylfluorene (0.2 g) was combined with 2.8 milligrams (mg) benzoyl peroxide in 1 mL degassed benzene and the mixture was heated at 66° C. overnight under a nitrogen atmosphere. The polymer was precipitated by pouring the reaction mixture into methanol, filtered and dried in a vacuum oven at 50° C. for 24 hours. As determined by gel permeation chromatography versus polystyrene standards, the polymer had weight average molecular weight (Mw) of 8,600 and number average molecular weight (Mn) of 5,100 with a polydispersity index of 1.68. The polymer was characterized by cyclic voltammetry in acetonitrile with tetra-n-butyl tetrafluoroborate as electrolyte using a glassy carbon working electrode and a platinum counter electrode.

EXAMPLE 5

Synthesis of poly(styrene-co-2-vinyl-7-benzothiazolyl-9,9'-dioctylfluorene): 2-Vinyl-7-benzothiazolyl-9,9'-dioctylfluorene (0.25 g) was combined with 0.75 g styrene and 3 mg 2,2'-azobisisobutyronitrile (AIBN) in 3 mL degassed benzene and the mixture was heated at 70° C. overnight under a nitrogen atmosphere. The copolymer was precipitated by pouring the reaction mixture into methanol, filtered and dried in a vacuum oven at 50° C. for 24 hours. As determined by gel permeation chromatography versus polystyrene standards, the copolymer had Mw of 96,600 and Mn of 65,500 with a polydispersity index of 1.47.

EXAMPLE 6

Synthesis of poly(styrene-co-2-vinyl-7-benzothiazolyl-9,9'-dioctylfluorene): 2-Vinyl-7-benzothiazolyl-9,9'-dioctylfluorene (0.5 g) was combined with 0.5 g styrene and 4.5 mg AIBN in 3 mL degassed benzene and the mixture was heated at 70° C. overnight under a nitrogen atmosphere. The copolymer was precipitated by pouring the reaction mixture into methanol, filtered and dried in a vacuum oven at 50° C. for 24 hours. As determined by gel permeation chromatography versus polystyrene standards, the copolymer had Mw of 70,100 and Mn of 37,000 with a polydispersity index of 1.89.

EXAMPLE 7

Synthesis of poly(styrene-co-2-vinyl-7-benzothiazolyl-9,9'-dioctylfluorene): 2-Vinyl-7-benzothiazolyl-9,9'-dioctylfluorene (0.75 g) was combined with 0.25 g styrene and 6 mg AIBN in 3 mL degassed benzene and the mixture was heated at 70° C. overnight under a nitrogen atmosphere. The copolymer was precipitated by pouring the reaction mixture into methanol, filtered and dried in a vacuum oven at 50° C. for 24 hours. As determined by gel permeation chromatography versus polystyrene standards, the copolymer had Mw of 34,500.

FIG. 1 shows the UV-visible absorption spectrum in chloroform solution and photoluminescence spectra for the homopolymer, PVFB, in chloroform solution and in the solid-state. A strong blue emission with lambda max of about 410 nm is observed in solution upon excitation at 345 nm. Excitation at 430 nm gives rise to a weakly fluorescent blue component with lambda max emission at 441 and 467 nm. Excitation of the same material at 345 nm as a film on quartz gave rise to strong blue fluorescence with lambda max emission at 441 and 467 nm, which overlays well with the solution excitation value.

Figure 2:
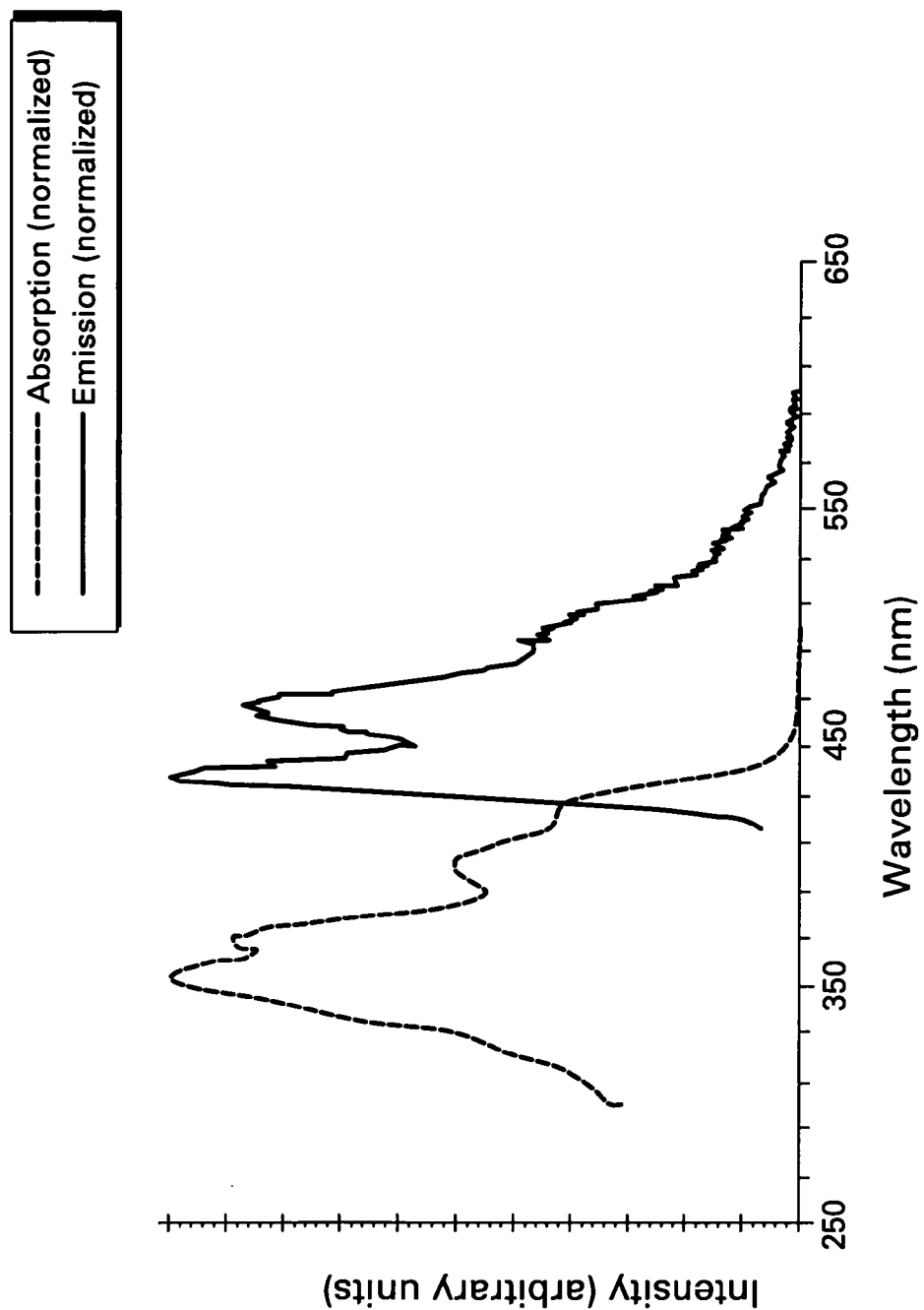
FIG. 2 shows film and chloroform solution optical properties of PVFBS-2 comprising about 50% structural units derived from styrene.

FIG. 2 illustrates the absorption and photoluminescence spectra of a copolymer (comprising structural units derived from 50 wt. % styrene) in chloroform solution with excitation at 410 nm. The figure shows that copolymer emits in the blue region of spectrum.

EXAMPLES 8–11

Examples of PVFB and PVFBS were prepared using methods similar to those described in Examples 4, 5 and 6. In particular, copolymer examples were prepared comprising structural units derived from 75 wt. % styrene (PVFBS-1), 50 wt. % styrene (PVFBS-2) and 25 wt. % styrene (PVFBS-3). Table 1 shows physical properties for these examples. Lambda (abs) refers to the absorption maximum in the ultraviolet range measured in chloroform solution. Lambda (PL) refers to the photoluminescence maximum measured in chloroform solution. HOMO and LUMO values were determined by cyclic voltammetry measurements on a thin film of the polymer on a glassy carbon electrode in acetonitrile/tetrabutylammonium fluoroborate solution using a platinum counter electrode and silver/silver nitrate reference electrode (aqueous ferrocene/ferrocenium external standard, 4.8 eV). Fluorescence quantum yields were determined in chloroform with coumarin 540 in ethyl acetate as reference. Weight average molecular weight values were determined in chloroform versus polystyrene standards.

TABLE 1

|  | Ex. 8 | Ex. 9 | Ex. 10 | Ex. 11 |
|---|---|---|---|---|
| Polymer | PVFB | PVFBS-1 | PVFBS-2 | PVFBS-3 |
| Lambda (abs), nm | 362 | 422 | 422 | 422 |
| Lambda (PL), nm | 403 | 435 | 436 | 433 |
| HOMO, eV | 6.02 | 5.9 | 5.95 | 5.9 |
| LUMO, eV | 3.08 | 2.63 | 2.72 | 2.72 |
| E gap, eV | 2.94 | 3.27 | 3.23 | 3.18 |
| Quantum yield, % | 59 | 97 | 97 | 97 |
| Mw | 23,800 | 114,600 | 99,600 | 156,600 |
| PDI | 2.01 | 2.3 | 2.79 | 5.1 |

As shown in Table 1, all the polymers exhibit efficient blue luminescence. A difference observed between the homopolymer and the copolymers is the relative quantum efficiency. Also a bathochromic shift occurs as less styrene is present in the copolymers. The optical and electrical properties indicate that these polymers are good candidates for the fabrication of blue-light-emitting devices, with HOMO's in the range of about 5.9 to 6.0 eV.

EXAMPLE 12

Synthesis of poly(methylmethacrylate-co-2-vinyl-7-benzothiazolyl-9,9'-dioctylfluorene: Copolymerization of methyl methacrylate (2.0 mL, 18.7 mmoles) with 2-vinyl-7-benzothiazolyl-9,9'-dioctylfluorene (100 mg, 0.18 mmoles) was performed in a septum-sealed serum bottle containing 12 mL benzene under nitrogen initiated by AIBN (40 mg, 0.24 mmoles) at 72° C. for 18 hours while protected from light. The viscous contents of the serum bottle were added dropwise to a stirring solution of methanol, resulting in precipitation of a fluffy, light green solid. The solids were collected by filtration and dried in vacuo resulting in 1.48 g product. The product was observed to emit blue fluorescence upon excitation by a hand-held UV lamp. Comparison of HOMO and LUMO level as measured by cyclic voltammetry of films of the copolymer spun onto a working electrode compared favorably to the results for the homopolymer of 2-vinyl-7-benzothiazolyl-9,9'-dioctylfluorene albeit with lower measured current.

EXAMPLE 13

Synthesis of poly(styrene-co-methylmethacrylate-co-2-vinyl-7-benzothiazolyl-9,9'-dioctylfluorene: Copolymerization of styrene, methyl methacrylate and 2-vinyl-7-benzothiazolyl-9,9'-dioctylfluorene in a wt./wt./wt. ratio of 75:25:25 is performed in a septum-sealed serum bottle containing a solvent which dissolves the reactants under nitrogen. The reaction mixture is heated in the presence of an initiator optionally with protection from light. The product is isolated by anti-solvent precipitation and collected by filtration and dried in vacuo. The desired terpolymer is obtained.

EXAMPLES 14–17

To measure electroluminescent properties, devices of the general structure ITO/PEDT:PSS/X/NaF/Al were made. The Indium-Tin-Oxide (ITO) films on glass were obtained from a subsidiary of Applied Films (Colorado Concept Coatings LLC) and patterned by photolithography. After the ITO was solvent cleaned and subjected to a 10 minute UV/ozone treatment, the conductive polymer poly(3,4-ethylenedioxythiophene)/poly(styrenesulfonate) (PEDT:PSS) (Baytron P VP CH 8000) was spun-cast from aqueous dispersion onto the ITO film and then the assembly was baked for at least 15 minutes at about 175° C. The polymers of Examples 8–11 (designated as X) was dissolved in an organic solvent (e.g. m-xylene) at a concentration of about 2 wt. %, and then spun-cast to form a film for an emissive layer of about 60 nm thickness on top of the PEDT:PSS layer. The devices were then moved into a vacuum deposition chamber located inside an argon-filled glove box, where a 4 nm thick film of sodium fluoride (NaF), followed by a film of aluminum (Al) about 100 nm thick were deposited through a shadow mask at a base pressure of about $2\times10^{-6}$ torr. For hole-only devices, a thin layer of gold was deposited instead of the NaF/Al top electrode. The devices were encapsulated with a cover glass and an edge seal using a UV-cured adhesive.

The current and brightness of the devices were measured vs. voltage with a Keithley sourcemeter and a calibrated photodiode, respectively, using standard measurement protocols. The main properties of the devices are listed in Table 2. Columns 3 and 4 list, respectively, the current density at 5 volts (V) and the voltage at a current density of 1 milliampere (mA) per square centimeter ($cm^2$) for hole-only structures. The remaining property columns refer to bipolar devices. The turn-on voltage is defined as the voltage for reaching a brightness 1 candela per square meter ($cd/m^2$), and the power efficiency watts/watts (W/W) is listed at 8 volts. The electroluminescence spectrum is described by lumens per watt radian (lm/Wrad), and the CIE x and y-coordinates. The devices reached a brightness of up to about 100 $cd/m^2$.

The hole-only devices showed a relatively high resistance. A large hole-injection barrier of about 1 electron volt (eV) between PEDT:PSS (work-function about 5.1 eV) and PVFB (HOMO about 6.0 eV) would be expected. The copolymers with styrene were more conductive. Although the invention is in no way dependent upon any theory of operation, this higher conductivity may correlate to the minor change in the HOMO values, or to changes of the hole mobility, or to changes in dipole layer formation at the PEDT interface. Among the copolymers, PVFBS2 that has a PVFB-to-styrene mole ratio of about 2, has a very high photoluminescence quantum efficiency in solution, and the best hole transport and electroluminescence (EL) efficiency. The power efficiency of up to 0.2% is similar to test devices obtained from commercially available polymers with similar energy levels, such as poly(9,9-dioctylfluorenyl-2.7-diyl) and poly(9,9-dihexylfluorenyl-2.7-diyl). A significant increase in efficiency can be expected by inserting a hole-transport layer between PEDT:PSS and these materials, or by blending a small percentage (for example, 10–25%) of a good hole-transporting material to form the emissive layer. All devices displayed a decay in conductivity and EL intensity of unknown origin, but likely from impurities as no special purification procedures beyond precipitation were performed.

TABLE 2

| Example # | X polymer | Hole-only mA/cm² at 5 volts | Hole-only volts at 1 mA/cm² | Turn-on voltage | W/W at 8 volts | lm/Wrad | CIEx | CIEy |
|---|---|---|---|---|---|---|---|---|
| 14 | PVFB | 0.004 | 8 | 7.2 | 0.1% | 204 | 0.172 | 0.22 |
| 15 | PVFBS-1 | 0.08 | 6.2 | 5.6 | 0.14% | 233 | 0.172 | 0.269 |
| 16 | PVFBS-2 | 0.33 | 5.5 | 4.8 | 0.2% | 230 | 0.169 | 0.267 |
| 17 | PVFBS-3 | 0.02 | 7.5 | 7 | 0.03% | 244 | 0.186 | 0.288 |

Figure 3:
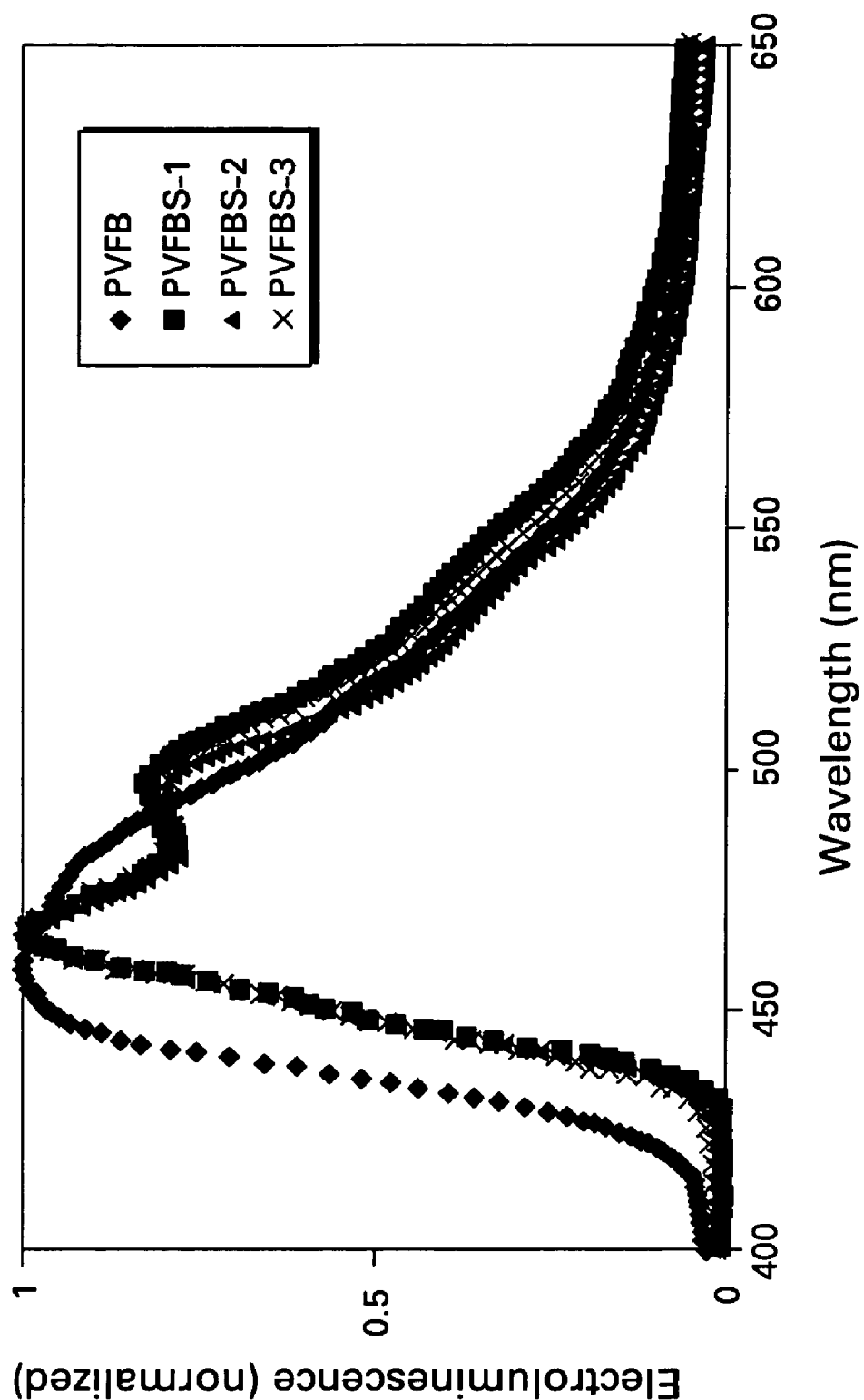
FIG. 3 shows normalized electroluminescence spectra of devices made with an emissive layer of examples 14 to 17.

FIG. 3 shows normalized electroluminescence spectra of devices made with an emissive layer of examples 14 to 17. In all cases the emissive layer was about 60 nm thick. The spectra for copolymer-comprising devices show a small red-shift and a clearer vibronic progression as compared to the spectrum for the homopolymer-comprising device.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims. All Patents and published articles cited herein are incorporated herein by reference.

The invention claimed is:

1. An electroactive device comprising a polymer comprising 2-(7-benzothiazolyl-9,9-disubstituted fluorene) structural units of the formula

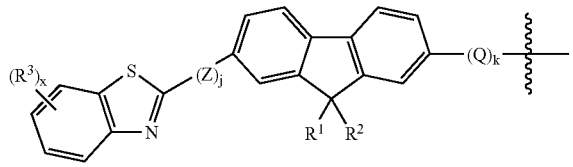

wherein $R^1$ and $R^2$ are each independently an alkyl group, an aralkyl group, an aryl group, or an —$Si(R)_3$ group wherein R is an alkyl group; $R^3$ is selected from the group consisting of an electron-donating substituent and an electron-withdrawing substituent; x has the value of from zero up to the number of hydrogens available for substitution on the aromatic ring; Z and Q are each independently a group which is in conjugation with both the fluorene group and the benzothiazole group; and the parameters j and k each independently have the value of 0–2.

2. The electroactive device of claim 1 wherein x is at least one and $R^3$ is alkyl, alkoxy, chloro, bromo, fluoro, nitrile or nitro.

3. The electroactive device of claim 1 wherein j or k, or both j and k have the value of 1, and Z or Q or both Z and Q are selected from the group consisting of phenyl, substituted phenyl, ethenyl, substituted ethenyl, and fluorenyl.

4. The electroactive device of claim 1 wherein $R^1$ and $R^2$ are each independently selected from the group consisting of phenyl, trialkylsilyl, trimethylsilyl, t-butyl, dimethylhexyl, ethylhexyl, n-octyl, and $C_6$–$C_{32}$ alkyl optionally substituted with one or more groups selected from $C_{1-C6}$ alkyl.

5. The electroactive device of claim 1 wherein x, j and k are zero, and $R^1$ and $R^2$ are the same.

6. The electroactive device of claim 5 wherein $R^1$ and $R^2$ are selected from the group consisting of phenyl, trialkylsilyl, trimethylsilyl, t-butyl, dimethylhexyl, ethylhexyl, n-octyl, and $C_6$–$C_{32}$ alkyl optionally substituted with one or more groups selected from $C_{1-C6}$ alkyl.

7. The electroactive device of claim 1 wherein the weight average molecular weight of the polymer is in a range of about 4,000 and about 200,000.

8. The electroactive device of claim 1, which is an electroluminescent device, an LED, an OLED, a photovoltaic device, a photoconductor, a photodetector, or in a chemical or biochemical sensor.

9. An electroactive device comprising: (a) an anode; (b) a cathode; and (c) a layer comprising the polymer of claim 1; wherein the layer (c) is a light emitting layer and the device emits light in the wavelength range of about 400 nm to about 650 nm; or wherein the layer (c) is a hole-blocking layer.

10. The electroactive device of claim 1 wherein the polymer further comprises structural units derived from at least one alkenyl aromatic compound, or from at least one monoethylenically unsaturated alkyl (meth)acrylate monomer selected from ($C_1$–$C_{12}$)alkyl(meth)acrylate monomers, or from a mixture of at least one alkenyl aromatic compound and at least one monoethylenically unsaturated alkyl (meth)acrylate monomer selected from ($C_1$–$C_{12}$)alkyl(meth)acrylate monomers.

11. The electroactive device of claim 10, which is an electroluminescent device, an LED, an OLED, a photovoltaic device, a photoconductor, a photodetector, or in a chemical or biochemical sensor.

12. An electroactive device comprising: (a) an anode; (b) a cathode; and (c) a layer comprising the polymer of claim 10; wherein the layer (c) is a light emitting layer and the device emits light in the wavelength range of about 400 nm to about 650 nm; or wherein the layer (c) is a hole-blocking layer.

13. The electroactive device of claim 10 wherein the polymer has the formula

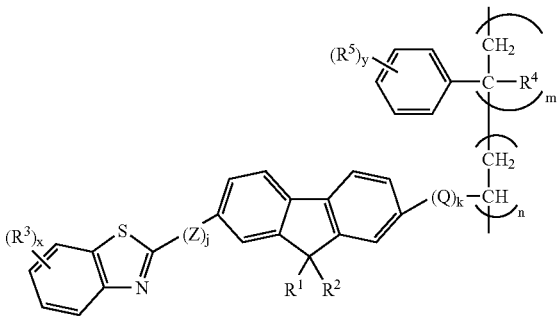

wherein $R^4$ is hydrogen or alkyl, and $R^5$ is selected from the group consisting of an electron-donating substituent and an electron-withdrawing substituent; and y has the value of from zero up to the number of hydrogens available for substitution.

14. The electroactive device of claim 10 wherein the polymer comprises structural units derived from at least one alkenyl aromatic compound selected from the group consisting of styrene, alpha-methyl styrene, 2-methylstyrene, 3-methylstyrene, 4-methylstyrene, alpha-methyl vinyltoluene, vinyl xylene, trimethyl styrene, 3,5-diethylstyrene, 4-n-propylstyrene, butyl styrene, 2-t-butylstyrene, 3-t-butylstyrene, 4-t-butylstyrene, styrenes having from 1 to 5 halogen substituents on the aromatic ring, chlorostyrene, alpha-chlorostyrene, dichlorostyrene, tetrachlorostyrene, bromostyrene, alpha-bromostyrene, dibromostyrene, p-hydroxystyrene, p-acetoxystyrene, methoxystyrene, vinyl-substituted condensed aromatic ring structures, vinyl naphthalene, vinyl anthracene, and mixtures of alkenyl aromatic compounds.

15. The electroactive device of claim 10 wherein the polymer comprises structural units derived from at least one alkenyl aromatic compound, said structural units being present in a range of between about 0.5 wt. % and about 85 wt. %, based on the total weight of the polymer.

16. The electroactive device of claim 10 wherein the weight average molecular weight of the polymer is in a range of about 4,000 and about 200,000.

17. An electroactive device comprising a polymer comprising 2-(7-benzothiazolyl-9,9-disubstituted fluorene) structural units of the formula

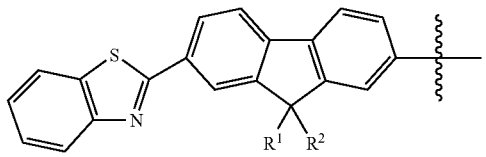

and optionally structural units derived from at least one alkenyl aromatic compound or from at least one monoethylenically unsaturated alkyl (meth)acrylate monomer, said optional structural units being present at a level of between about 0.5 wt. % and about 85 wt. %, based on the total weight of the polymer;

wherein $R^1$ and $R^2$ are the same and are selected from the group consisting of phenyl, trialkylsilyl, trimethylsilyl, t-butyl, dimethylhexyl, ethylhexyl, n-octyl, and $C_6$–$C_{32}$ alkyl optionally substituted with one or more groups selected from $C_1$–$C_6$ alkyl; and wherein the polymer has a weight average molecular weight in a range of about 4,000 and about 200,000.

18. The electroactive device of claim 17 wherein the polymer further comprises structural units derived from methyl methacrylate.

19. The electroactive device of claim 17 wherein the polymer further comprises structural units derived from styrene.

20. The electroactive device of claim 17, which is an electroluminescent device, an LED, an OLED, a photovoltaic device, a photoconductor, a photodetector, or in a chemical or biochemical sensor.

21. An electroactive device comprising: (a) an anode; (b) a cathode; and (c) a layer comprising the polymer of claim 17; wherein the layer (c) is a light emitting layer and the device emits light in the wavelength range of about 400 nm to about 650 nm; or wherein the layer (c) is a hole-blocking layer.

22. An electroactive device comprising a polymer comprising structural units derived from a monomer of formula

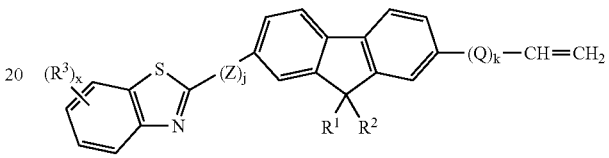

wherein
$R^1$ and $R^2$ are each independently an alkyl group, an aralkyl group, an aryl group, or an —Si(R)$_3$ group;
R is an alkyl group;
$R^3$ is selected from the group consisting of an electron-donating substituent and an electron-withdrawing substituent;
x has the value of from zero up to the number of hydrogens available for substitution on the aromatic ring;
Z and Q are each independently a group which is in conjugation with both the fluorene group and the benzothiazole group; and
j and k each independently have the value of 0–2.

23. The electroactive device of claim 22 wherein the polymer further comprises structural units derived from methyl methacrylate.

24. The electroactive device of claim 22 wherein the polymer further comprises structural units derived from styrene.

25. The electroactive device of claim 22 wherein x, j and k are 0.

26. The electroactive device of claim 25 wherein the polymer further comprises structural units derived from methyl methacrylate.

27. The electroactive device of claim 25 wherein the polymer further comprises structural units derived from styrene.

* * * * *